(12) United States Patent
Blanch et al.

(10) Patent No.: US 12,294,561 B2
(45) Date of Patent: May 6, 2025

(54) AUTOMATED SOCIAL DISTANCING RECOMMENDATIONS

(71) Applicant: International Business Machines Corporation, Armonk, NY (US)

(72) Inventors: David Blanch, Austin, TX (US); Michael Domitrovits, New Paltz, NY (US); Mark McCann, Willow Springs, IL (US)

(73) Assignee: International Business Machines Corporation, Armonk, NY (US)

( * ) Notice: Subject to any disclaimer, the term of this patent is extended or adjusted under 35 U.S.C. 154(b) by 344 days.

(21) Appl. No.: 17/184,687

(22) Filed: Feb. 25, 2021

(65) Prior Publication Data

US 2022/0272064 A1   Aug. 25, 2022

(51) Int. Cl.
  *H04W 64/00* (2009.01)
  *G06F 16/2457* (2019.01)
  *G06F 30/13* (2020.01)
  *G06V 20/00* (2022.01)
  *G06V 20/52* (2022.01)
  *H04L 51/222* (2022.01)
  *H04W 4/33* (2018.01)

(52) U.S. Cl.
  CPC ...... *H04L 51/222* (2022.05); *G06F 16/24575* (2019.01); *G06F 30/13* (2020.01); *G06V 20/36* (2022.01); *G06V 20/53* (2022.01); *H04W 4/33* (2018.02)

(58) Field of Classification Search
None
See application file for complete search history.

(56) References Cited

U.S. PATENT DOCUMENTS

| | | | | |
|---|---|---|---|---|
| 10,564,881 B2 * | 2/2020 | Zhou | | G06F 3/0604 |
| 2015/0088570 A1 | 3/2015 | Yenni | | |
| 2017/0176964 A1 | 6/2017 | O'Keeffe | | |
| 2017/0315707 A1 * | 11/2017 | Jones | | G06F 3/0484 |

(Continued)

FOREIGN PATENT DOCUMENTS

| | | |
|---|---|---|
| CN | 104820995 A | 8/2015 |
| IN | 109685009 A | 4/2019 |
| JP | 5960062 B2 | 8/2016 |

OTHER PUBLICATIONS

IBM, "Enterprise Asset management: Worker Insights | IBM Watson IoT", IBM, Accessed on Nov. 25, 2020, 11 Pages.

(Continued)

*Primary Examiner* — Willie J Daniel, Jr.
(74) *Attorney, Agent, or Firm* — Michael O'Keefe (57) ABSTRACT

In an approach to automated social distancing recommendations, one or more computer processors monitor first data associated with a utilization of a physical space. One or more computer processors determine the first data associated with the utilization of the physical space exceeds a space utilization threshold. Based on the first data associated with the utilization of the physical space exceeding the space utilization threshold, one or more computer processors generate second data associated with the physical space. One or more computer processors send a notification, where the notification includes the generated second data associated with the physical space.

20 Claims, 3 Drawing Sheets

(56) References Cited

U.S. PATENT DOCUMENTS

2017/0341746 A1 11/2017 Erickson
2018/0311572 A1 11/2018 Pickover

OTHER PUBLICATIONS

IBM, "Tririga Overview", IBM, Accessed on Jun. 26, 2020, 4 Pages.
O'Brien, Ed, "IBM Launches Watson Works to Address the Challenges of Returning to the Workplace", ARC Advisory Group, Jun. 19, 2020, 2 Pages.

* cited by examiner

AUTOMATED SOCIAL DISTANCING RECOMMENDATIONS

BACKGROUND OF THE INVENTION

The present invention relates generally to the field of the Internet of Things, and more particularly to automated social distancing recommendations.

The Internet of Things (IoT) is the internetworking of physical devices (also referred to as "connected devices" and "smart devices"), vehicles, buildings, and other items, embedded with electronics, software, sensors, actuators, and network connectivity that enable these objects to collect and exchange data. The IoT allows objects to be sensed and/or controlled remotely across existing network infrastructure, creating opportunities for more direct integration of the physical world into computer-based systems, and resulting in improved efficiency, accuracy, and economic benefit in addition to reduced human intervention. Each "thing" is uniquely identifiable through its embedded computing system but is able to interoperate within the existing Internet infrastructure.

In public health, social distancing, also called physical distancing, is a set of non-pharmaceutical interventions or measures intended to prevent the spread of a contagious disease by maintaining a physical distance between people and reducing the number of times people come into close contact with each other. Social distancing typically involves keeping a certain distance from others and avoiding gathering together in large groups. By minimizing the probability that a given uninfected person will come into physical contact with an infected person, disease transmission can be suppressed.

An integrated workplace management system (IWMS) is a software platform that helps organizations optimize the use of workplace resources, including the management of a company's real estate portfolio, infrastructure, and facilities assets. IWMS solutions are commonly packaged as a fully integrated suite or as individual modules that can be scaled over time. An IWMS may be used by corporate occupiers, real estate services firms, facilities services providers, landlords, and managing agents.

SUMMARY

Embodiments of the present invention disclose a computer-implemented method, a computer program product, and a system for automated social distancing recommendations. The computer-implemented method may include one or more computer processors monitoring first data associated with a utilization of a physical space. One or more computer processors determine the first data associated with the utilization of the physical space exceeds a space utilization threshold. Based on the first data associated with the utilization of the physical space exceeding the space utilization threshold, one or more computer processors generate second data associated with the physical space. One or more computer processors send a notification, where the notification includes the generated second data associated with the physical space.

DETAILED DESCRIPTION

In an era where infectious diseases can disrupt locations such as business environments and sports venues, social distancing is one protocol that can be used to enable people to safely return to such places. Monitoring proper social distancing protocols in physical spaces that were designed and/or optimized for collaboration and maximum capacity can be difficult. Embodiments of the present invention recognize that safety from contracting an infectious disease while in a location with other people can be improved by implementing a system that can monitor the physical space and alert users when the space becomes too crowded for proper social distancing protocols. Embodiments of the present invention also recognize that safety can be improved by generating data regarding physical space utilization that offers insights into stress points in a floor plan or building design that can then be changed to meet social distancing requirements. Implementation of embodiments of the invention may take a variety of forms, and exemplary implementation details are discussed subsequently with reference to the Figures.

Figure 1:
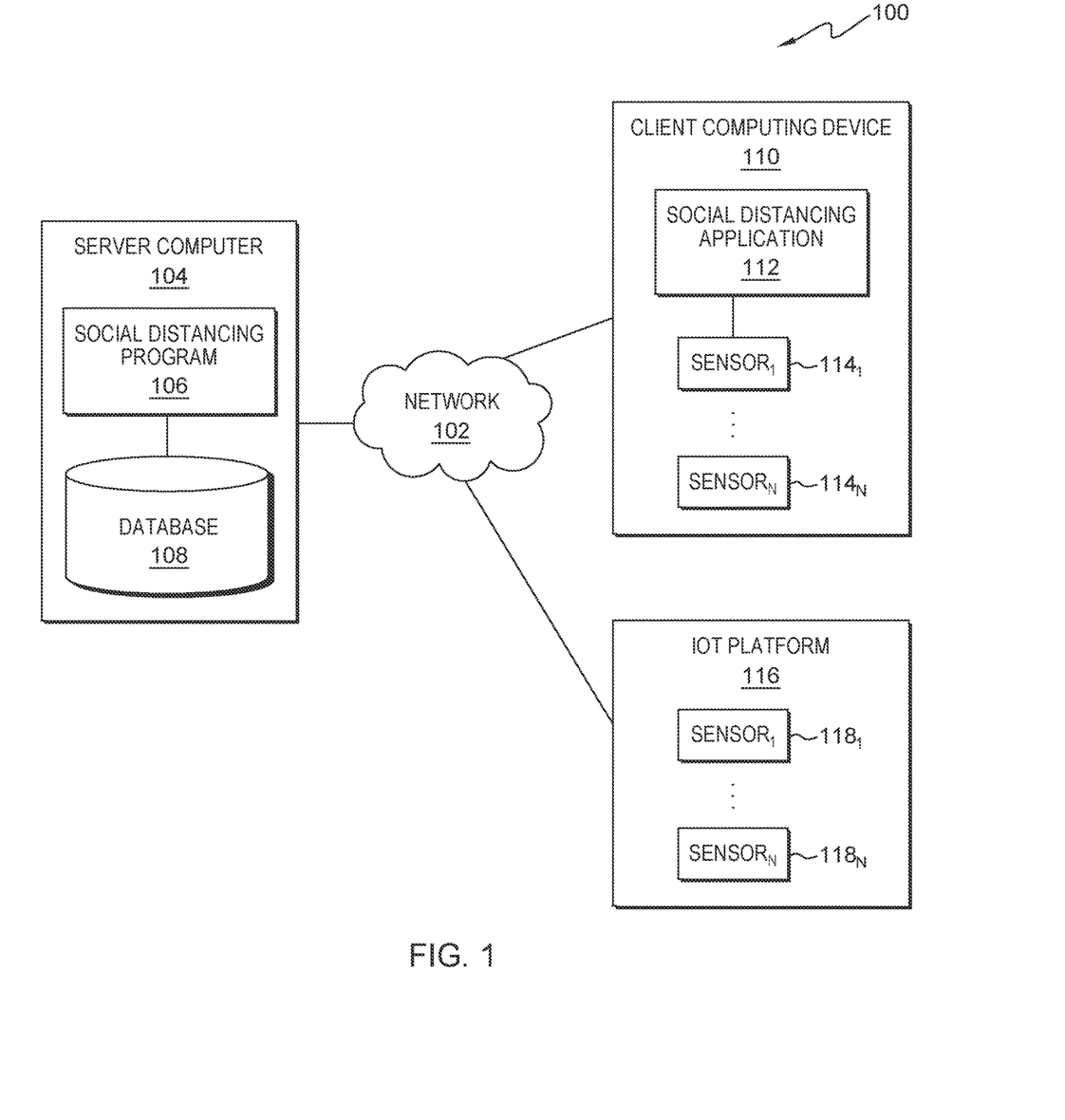
FIG. 1 is a functional block diagram illustrating a distributed data processing environment, in accordance with an embodiment of the present invention.

FIG. 1 is a functional block diagram illustrating a distributed data processing environment, generally designated 100, in accordance with one embodiment of the present invention. The term "distributed" as used herein describes a computer system that includes multiple, physically distinct devices that operate together as a single computer system. FIG. 1 provides only an illustration of one implementation and does not imply any limitations with regard to the environments in which different embodiments may be implemented. Many modifications to the depicted environment may be made by those skilled in the art without departing from the scope of the invention as recited by the claims.

Distributed data processing environment 100 includes server computer 104, client computing device 110, and Internet of Things (IoT) platform 116 interconnected over network 102. Network 102 can be, for example, a telecommunications network, a local area network (LAN), a wide area network (WAN), such as the Internet, or a combination of the three, and can include wired, wireless, or fiber optic connections. Network 102 can include one or more wired and/or wireless networks capable of receiving and transmitting data, voice, and/or video signals, including multimedia signals that include voice, data, and video information. In general, network 102 can be any combination of connections and protocols that will support communications between server computer 104, client computing device 110, and IoT platform 116, and other computing devices (not shown) within distributed data processing environment 100.

Server computer 104 can be a standalone computing device, a management server, a web server, a mobile computing device, or any other electronic device or computing system capable of receiving, sending, and processing data. In other embodiments, server computer 104 can represent a server computing system utilizing multiple computers as a server system, such as in a cloud computing environment. In another embodiment, server computer 104 can be a laptop computer, a tablet computer, a netbook computer, a personal computer (PC), a desktop computer, a personal digital assistant (PDA), a smart phone, or any programmable electronic device capable of communicating with client computing device 110, IoT platform 116, and other computing devices (not shown) within distributed data processing environment 100 via network 102. In another embodiment, server computer 104 represents a computing system utilizing clustered computers and components (e.g., database server computers, application server computers, etc.) that act as a single pool of seamless resources when accessed within distributed data processing environment 100. Server computer 104 includes social distancing program 106 and database 108. Server computer 104 may include internal and external hardware components, as depicted and described in further detail with respect to FIG. 3.

Social distancing program 106 utilizes occupancy and movement data of one or more users in a physical location to trigger a notification regarding social distancing protocols and strategy. Social distancing program 106 also produces a floor plan for the physical location that is optimized for the enforcement of social distancing protocols, and therefore reduces an opportunity for disease spread. Social distancing program 106 monitors utilization of a physical space. Social distancing program 106 retrieves metadata and user data associated with the physical space. If social distancing program 106 determines a space utilization threshold is exceeded, then social distancing program 106 generates physical space data and sends a notification. In the depicted embodiment, social distancing program 106 is a standalone program. In another embodiment, social distancing program 106 is a component or function of an integrated workplace management system (IWMS). Social distancing program 106 is depicted and described in further detail with respect to FIG. 2.

Database 108 stores information used and generated by social distancing program 106. In the depicted embodiment, database 108 resides on server computer 104. In another embodiment, database 108 may reside elsewhere within distributed data processing environment 100, provided social distancing program 106 has access to database 108. A database is an organized collection of data. Database 108 can be implemented with any type of storage device capable of storing data and configuration files that can be accessed and utilized by social distancing program 106, such as a database server, a hard disk drive, or a flash memory.

Database 108 stores data generated by sensors included in client computing device 110 and IoT platform 116. Database 108 also stores metadata associated with the sensor data. In addition, database 108 stores data specific to the physical space, or location, that describes the space. For example, database 108 may store a computer aided design (CAD) plan of the space. In another example, database 108 may store one or more codes associated with the Open Standards Consortium for Real Estate (OSCRE) associated with the space. Database 108 may also store historical indoor location data, such as XY coordinates within a floor plan.

Database 108 also stores data generated by social distancing application 112 on client computing device 110, which may include user information, such as a user profile. User profile information can include, but is not limited to, a name, an address, an email address, a credit card number, an account number, an employer, a job role, a job family, a business unit association, a job seniority, a job level, a medical record, etc. Database 108 may also store user preferences with respect to social distancing protocols, notifications, etc. In addition, database 108 may store a company directory that lists, for example, employees, job titles, and office locations. Further, database 108 stores one or more established space utilization thresholds that social distancing program 106 uses to determine whether to send a notification.

The present invention may contain various accessible data sources, such as database 108, that may include personal data, content, or information the user wishes not to be processed. Personal data includes personally identifying information or sensitive personal information as well as user information, such as tracking or geolocation information. Processing refers to any operation, automated or unautomated, or set of operations such as collecting, recording, organizing, structuring, storing, adapting, altering, retrieving, consulting, using, disclosing by transmission, dissemination, or otherwise making available, combining, restricting, erasing, or destroying personal data. Social distancing program 106 enables the authorized and secure processing of personal data. Social distancing program 106 provides informed consent, with notice of the collection of personal data, allowing the user to opt in or opt out of processing personal data. Consent can take several forms. Opt-in consent can impose on the user to take an affirmative action before personal data is processed. Alternatively, opt-out consent can impose on the user to take an affirmative action to prevent the processing of personal data before personal data is processed. Social distancing program 106 provides information regarding personal data and the nature (e.g., type, scope, purpose, duration, etc.) of the processing. Social distancing program 106 provides the user with copies of stored personal data. Social distancing program 106 allows the correction or completion of incorrect or incomplete personal data. Social distancing program 106 allows the immediate deletion of personal data.

Client computing device 110 can be one or more of a laptop computer, a tablet computer, a smart phone, smart watch, a smart speaker, or any programmable electronic device capable of communicating with various components and devices within distributed data processing environment 100, via network 102. Client computing device 110 may be a wearable computer. Wearable computers are miniature electronic devices that may be worn by the bearer under, with, or on top of clothing, as well as in or connected to glasses, hats, or other accessories. Wearable computers are especially useful for applications that require more complex computational support than merely hardware coded logics. In one embodiment, the wearable computer may be in the form of a head mounted display. The head mounted display may take the form-factor of a pair of glasses. In an embodiment, the wearable computer may be in the form of a smart watch. In an embodiment, client computing device 110 may be integrated into a vehicle of the user. For example, client computing device 110 may include a heads up display in the windshield of the vehicle. In general, client computing device 110 represents one or more programmable electronic devices or combination of programmable electronic devices capable of executing machine readable program instructions and communicating with other computing devices (not shown) within distributed data processing environment 100 via a network, such as network 102. Client computing device 110 includes an instance of social distancing application 112 and sensor $114_{1-N}$.

Social distancing application 112 provides an interface between social distancing program 106 on server computer 104 and a user of client computing device 110. In one embodiment, social distancing application 112 is mobile application software. Mobile application software, or an "app," is a computer program designed to run on smart phones, tablet computers and other mobile devices. In one embodiment, social distancing application 112 may be a graphical user interface (GUI) or a web user interface (WUI) and can display text, documents, web browser windows, user options, application interfaces, and instructions for operation, and include the information (such as graphic, text, and sound) that a program presents to a user and the control sequences the user employs to control the program. Social distancing application 112 enables a user of client computing device 110 to receive notifications regarding social distancing protocols, physical space utilization density, and recommendations for improving social distancing in a physical space. Social distancing application 112 also enables a user of client computing device 110 to provide user profile information and preferences to social distancing program 106.

Internet of things (IoT) platform 116 is a suite of components that enable a) deployment of applications that monitor, manage, and control connected devices and sensors; b) remote data collection from connected devices; and c) independent and secure connectivity between devices. The components may include, but are not limited to, a hardware architecture, an operating system, or a runtime library (not shown). In the depicted embodiment, IoT platform 116 includes sensor $118_{1-N}$. In another embodiment, IoT platform 116 may include a plurality of other connected computing devices. For example, IoT platform 116 may include security devices, such as alarms, smoke detectors, and video doorbells. In another example, IoT platform 116 may include a climate control system or various appliances. In yet another example, IoT platform 116 may include a virtual assistant. In an embodiment, one or more devices included in IoT platform 116 may include a machine learning component that can learn a user's preferences over time by observing the user's actions. For example, an intelligent home climate control system may detect a pattern such as the user setting a thermostat for 65 degrees Fahrenheit in the mornings on Monday through Friday, when the user is not at home, and adjusting the thermostat to 70 degrees Fahrenheit for the rest of the time. Based on this pattern, the IoT device can set the thermostat without user intervention.

Sensor $114_{1-N}$ and sensor $118_{1-N}$, hereinafter sensor(s) 114 and sensor(s) 118, detect a plurality of attributes of a user of social distancing application 112 and of the environment of the user. As used herein, N represents a positive integer, and accordingly the number of scenarios implemented in a given embodiment of the present invention is not limited to those depicted in FIG. 1. A sensor is a device that detects or measures a physical property and then records or otherwise responds to that property, such as vibration, chemicals, radio frequencies, environment, weather, humidity, light, etc. Sensor(s) 114 and sensor(s) 118 may be one or more of a plurality of types of camera, including, but not limited to, pin-hole, stereo, omni-directional, non-central, infrared, video, digital, three dimensional, panoramic, filter-based, wide-field, narrow-field, telescopic, microscopic, etc. In some embodiments, sensor(s) 114 and sensor(s) 118 include any device capable of imaging a portion of the electromagnetic spectrum. If client computing device 110 is a wearable device, then sensor(s) 114 may include biometric sensors for detecting the physical condition of the user, such as blood pressure, heart rate, respiratory rate, calories burned, calories consumed, pulse, oxygen levels, blood oxygen level, glucose level, blood pH level, salinity of user perspiration, skin temperature, galvanic skin response, electrocardiography data, body temperature, eye tracking data, etc. Sensor(s) 114 and sensor(s) 118 may be one or more of a plurality of types of microphone for detecting speech and other audible sounds. Sensor(s) 114 and sensor(s) 118 may be one or more of a plurality of types of gyroscopic sensors that can detect movement. Sensor(s) 114 and sensor(s) 118 may be one or more of a plurality of types of pressure sensors. Sensor(s) 114 and sensor(s) 118 may be able to detect weather conditions, such as air temperature, relative humidity, presence and type of precipitation, wind speed, etc., as social distancing protocols may depend on the weather conditions. Sensor(s) 114 and sensor(s) 118 may be global positioning system (GPS) sensors, beacons, and/or Bluetooth® sensors that can detect geo-location or movement of one or more users. Sensor(s) 114 and sensor(s) 118 may also be one or more of a plurality of types of near-field communications sensors. Sensor(s) 118 may be integrated into a physical space. For example, sensor(s) 118 may be occupancy sensors and/or desk sensors. In another example, sensor(s) 118 may be able to detect a swipe of an ID badge at the entry of a building or other location. Sensor(s) 118 may be able to detect Wi-Fi® signals.

Figure 2:
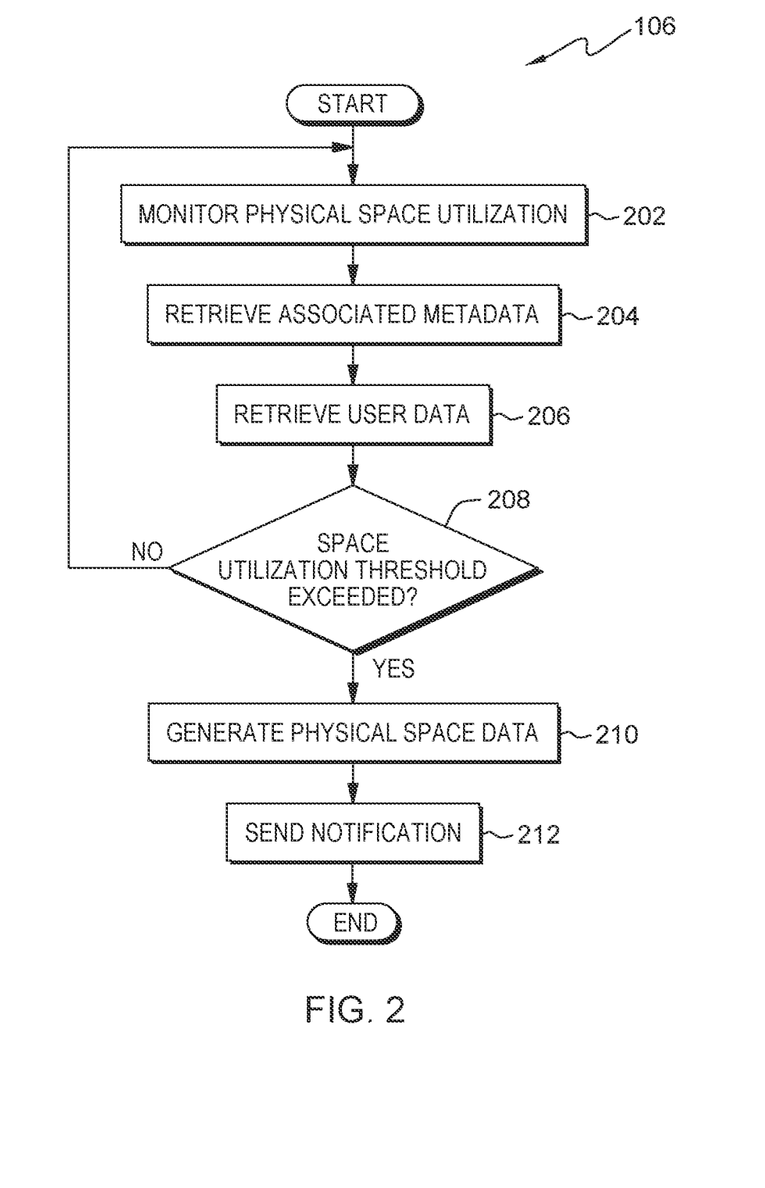
FIG. 2 is a flowchart depicting operational steps of a social distancing program, on a server computer within the distributed data processing environment of FIG. 1, for automated social distancing recommendations, in accordance with an embodiment of the present invention.

FIG. 2 is a flowchart depicting operational steps of social distancing program 106, on server computer 104 within distributed data processing environment 100 of FIG. 1, for automated social distancing recommendations, in accordance with an embodiment of the present invention.

Social distancing program 106 monitors physical space utilization (step 202). In an embodiment, social distancing program 106 monitors utilization of a physical space by users in the physical space to determine a current space utilization. The physical space may include, but is not limited to, a conference room, an agile workspace, an open-air workspace, a phone booth, a dedicated desk, a floor of a building, a restaurant or other food establishment, a store, and a dedicated office room. The physical space may be a workplace, an entertainment venue, a shopping venue, etc. As users of the physical space move about, social distancing program 106 monitors the movement of the users and occupancy of the physical space by receiving and/or retrieving data and storing the data in database 108. In an embodiment, social distancing program 106 uses data received from sensor(s) 114 to monitor movement of the user of client computing device 110. For example, if sensor(s) 114 include a GPS sensor, then social distancing program 106 monitors the location of the user of client computing device 110 via the GPS sensor. In an embodiment, social distancing program 106 uses data received from sensor(s) 118 to monitor one or more users in the physical space. For example, if sensor(s) 118 include one or more cameras positioned around the physical space, then social distancing program 106 monitors the movement of one or more users and/or the utilization of the physical space via images captured by the cameras.

Social distancing program 106 retrieves associated metadata (step 204). In an embodiment, in addition to the data used to monitor physical space utilization, social distancing program 106 retrieves metadata associated with the space utilization data from database 108. The retrieved metadata may include, but is not limited to, a date and/or time associated with the space utilization data, time spent in a physical space by a user, total time spent by all users of a physical space, current weather conditions, and décor, such as wall color, of the physical space. Social distancing program 106 gleans insights regarding the utilization of the space based on the retrieved metadata. For example, social distancing program 106 determines that a particular space is crowded because it is currently raining outside. In another example, social distancing program 106 determines which spaces are underutilized based on the lack of attraction to the décor or furniture in a space by comparing utilization of a plurality of spaces. In an embodiment, metadata associated with the utilization of a physical space also includes specific data describing the space. The specific data may include, but is not limited to, a CAD plan of the space, an OSCRE code associated with the space, a building identification, a floor number, temperature and/or humidity in the space, a noise level, and a lighting level.

Social distancing program 106 retrieves user data (step 206). In an embodiment, social distancing program 106 retrieves data specific to one or more users detected in the physical space from database 108. For example, social distancing program 106 may retrieve user profile data that indicates information associated with a user, such as data associated with a job role of the user. By gathering job role specific information, social distancing program 106 can determine recommendations based on the utilization of the respective users. In an embodiment, social distancing program 106 retrieves data specific to a user directly from sensor(s) 114. For example, social distancing program 106 retrieves health data, such as a temperature, heart rate, blood pressure, etc., which may be indicative of whether the user is ill. In an embodiment, social distancing program 106 retrieves data specific to one or more users directly from sensor(s) 118. For example, social distancing program 106 may retrieve data such as a height and/or weight of a user to determine how much area or volume the user will take up in a physical space. Retrieving data associated with users of the physical space enables social distancing program 106 to identify why some spaces are utilized while other spaces are not utilized.

Social distancing program 106 determines whether a space utilization threshold has been exceeded (decision block 208). A space utilization threshold may be implemented in a physical space to prevent close contact between users of the space, such as for meeting social distancing requirements. A space utilization threshold may also be based on a maximum occupancy level, such as required by government safety criteria. A space utilization threshold may be dependent on space attributes, such as a number of desks in the space and/or the size of the desks. In an embodiment, social distancing program 106 retrieves a space utilization threshold from database 108. Social distancing program 106 compares the current space utilization to the space utilization threshold to determine if the threshold has been exceeded.

If social distancing program 106 determines a space threshold has not been exceeded ("no" branch, decision block 208), then social distancing program 106 returns to step 202 and continues to monitor the utilization of the physical space.

If social distancing program 106 determines a space threshold has been exceeded ("yes" branch, decision block 208), then social distancing program 106 generates physical space data (step 210). In an embodiment, based on the space utilization, the retrieved metadata, and/or the retrieved user data, social distancing program 106 generates data associated with the space utilization that exceeds the space utilization threshold. For example, social distancing program 106 generates a report that summarizes which spaces are experiencing crowds that exceed the threshold and which spaces are available to alleviate the overcrowding. In another example, social distancing program 106 generates a report that summarizes which spaces attract too many users and which spaces are underutilized, including attributes of the spaces. Social distancing program 106 may also generate one or more recommendations for users of spaces in a building with safer user densities based on the current physical space utilization data. In an embodiment, social distancing program 106 generates physical space data associated with reserved spaces and/or unreserved spaces.

In some embodiments, social distancing program 106 generates insights into opportunities to optimize space utilization. For example, social distancing program 106 generates data describing attributes of users that spend more time in certain types or locations of spaces, such as users in particular job roles. In another example, social distancing program 106 generates data that indicates frequency and duration of time spent by one or more users in certain types or locations of spaces, enabling improvement to cleaning requirements and schedules. In other embodiments, social distancing program 106 also generates one or more recommendations for improvement to space utilization. For example, social distancing program 106 produces a modified floor plan design layout for planners to review to address any stress points in the design based on location, movement, and individual thresholds being exceeded in the space, thus, proposing an optimal design layout, rearranging spaces to meet set criteria and/or thresholds for social distancing and/or occupancy. In another example, social distancing program 106 produces an active view of how the space is being utilized, i.e., circulation space, as well as the fixed spaces, such as desks, etc., thus, enabling users to see where the most active movement is occurring and where individual thresholds are met within a floor plan. In a further example, social distancing program 106 generates movement simulations based on previous floor plan layouts and compare movement patterns to one or more other locations. In the example, social distancing program 106 uses historical indoor location data (e.g., XY coordinates within a floor plan), stored in database 108, and the occupants' current position relative to objects within the space (e.g., desks, offices, hallways, etc.) to produce a simulated flow of occupants. Further, in other embodiments, social distancing program 106 generates a heat map simulation as a visualization for a space planner to enable prediction of effectiveness and improvement of the design.

Social distancing program 106 sends a notification (step 212). In an embodiment, in response to determining a space utilization threshold has been exceeded, social distancing program 106 sends a notification to one or more interested parties. For example, social distancing program 106 sends a notification to a user of client computing device 110, via social distancing application 112, with a recommendation of one or more other locations to which the user can move to alleviate the overcrowding situation and where social distancing requirements can be met, and thus reduce space utilization to below the threshold. In a further example, social distancing program 106 determines which users are scheduled to arrive in a currently overcrowded area, but are not already there, and sends a notification which recommends that the users avoid the location. In another example, social distancing program 106 sends a notification to a facilities manager to alert the facilities manager that the space utilization threshold has been exceeded such that the facilities manager can take action. In an embodiment, the notification includes a report of the generated physical space data, as was discussed with respect to step 210. For example, social distancing program 106 generates a report that describes one or more generated insights into opportunities to optimize space utilization, as described above.

Figure 3:
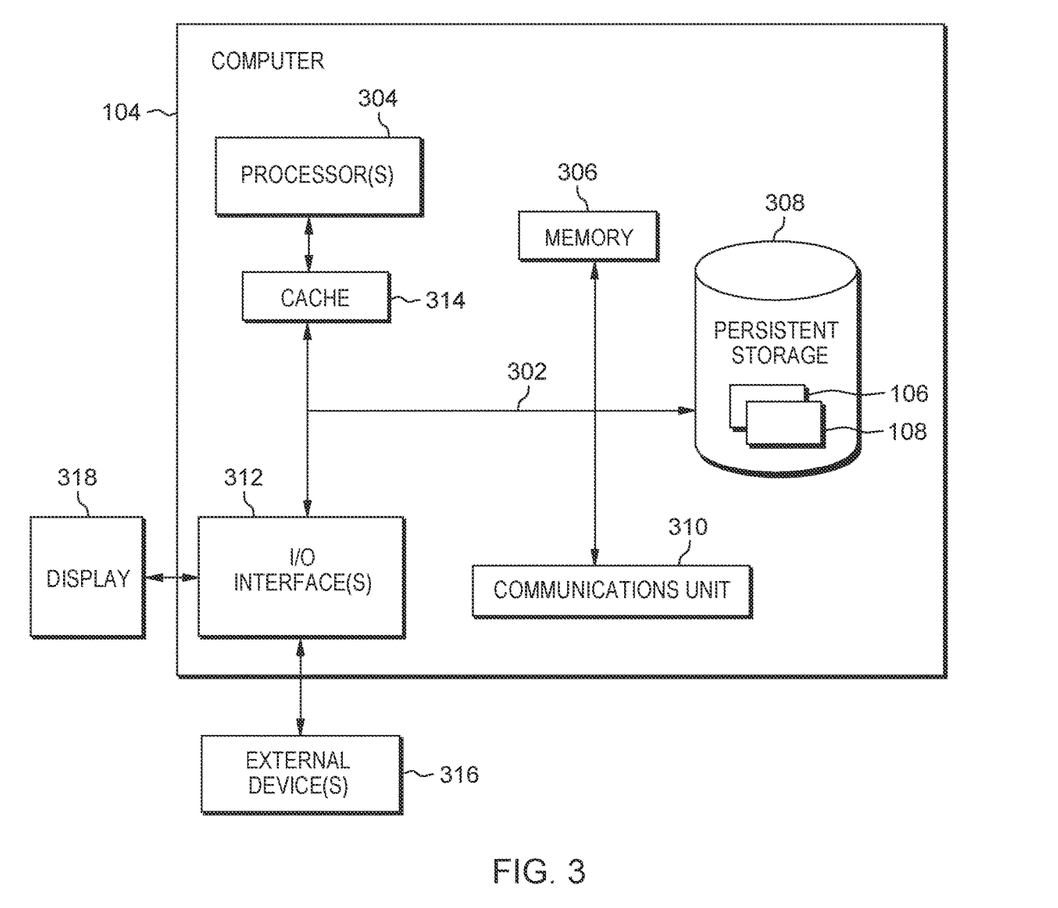
FIG. 3 depicts a block diagram of components of the server computer executing the social distancing program within the distributed data processing environment of FIG. 1, in accordance with an embodiment of the present invention.

FIG. 3 depicts a block diagram of components of server computer 104 within distributed data processing environment 100 of FIG. 1, in accordance with an embodiment of the present invention. It should be appreciated that FIG. 3 provides only an illustration of one implementation and does not imply any limitations with regard to the environments in which different embodiments can be implemented. Many modifications to the depicted environment can be made.

Server computer 104 can include processor(s) 304, cache 314, memory 306, persistent storage 308, communications unit 310, input/output (I/O) interface(s) 312 and communications fabric 302. Communications fabric 302 provides communications between cache 314, memory 306, persistent storage 308, communications unit 310, and input/output (I/O) interface(s) 312. Communications fabric 302 can be implemented with any architecture designed for passing data and/or control information between processors (such as microprocessors, communications and network processors, etc.), system memory, peripheral devices, and any other hardware components within a system. For example, communications fabric 302 can be implemented with one or more buses.

Memory 306 and persistent storage 308 are computer readable storage media. In this embodiment, memory 306 includes random access memory (RAM). In general, memory 306 can include any suitable volatile or non-volatile computer readable storage media. Cache 314 is a fast memory that enhances the performance of processor(s) 304 by holding recently accessed data, and data near recently accessed data, from memory 306.

Program instructions and data used to practice embodiments of the present invention, e.g., social distancing program 106 and database 108, are stored in persistent storage 308 for execution and/or access by one or more of the respective processor(s) 304 of server computer 104 via cache 314. In this embodiment, persistent storage 308 includes a magnetic hard disk drive. Alternatively, or in addition to a magnetic hard disk drive, persistent storage 308 can include a solid-state hard drive, a semiconductor storage device, a read-only memory (ROM), an erasable programmable read-only memory (EPROM), a flash memory, or any other computer readable storage media that is capable of storing program instructions or digital information.

The media used by persistent storage 308 may also be removable. For example, a removable hard drive may be used for persistent storage 308. Other examples include optical and magnetic disks, thumb drives, and smart cards that are inserted into a drive for transfer onto another computer readable storage medium that is also part of persistent storage 308.

Communications unit 310, in these examples, provides for communications with other data processing systems or devices, including resources of client computing device 110 and IoT platform 116. In these examples, communications unit 310 includes one or more network interface cards. Communications unit 310 may provide communications through the use of either or both physical and wireless communications links. Social distancing program 106, database 108, and other programs and data used for implementation of the present invention, may be downloaded to persistent storage 308 of server computer 104 through communications unit 310.

I/O interface(s) 312 allows for input and output of data with other devices that may be connected to server computer 104. For example, I/O interface(s) 312 may provide a connection to external device(s) 316 such as a keyboard, a keypad, a touch screen, a microphone, a digital camera, and/or some other suitable input device. External device(s) 316 can also include portable computer readable storage media such as, for example, thumb drives, portable optical or magnetic disks, and memory cards. Software and data used to practice embodiments of the present invention, e.g., social distancing program 106 and database 108 on server computer 104, can be stored on such portable computer readable storage media and can be loaded onto persistent storage 308 via I/O interface(s) 312. I/O interface(s) 312 also connect to a display 318.

Display 318 provides a mechanism to display data to a user and may be, for example, a computer monitor. Display 318 can also function as a touch screen, such as a display of a tablet computer.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be any tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, a special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, a segment, or a portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The foregoing descriptions of the various embodiments of the present invention have been presented for purposes of illustration and example, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A computer-implemented method comprising:
monitoring, by one or more computer processors, first data associated with a utilization of a first floor plan of a physical space;
generating one or more insights regarding the utilization of the first floor plan based on metadata associated with the first data, wherein the metadata includes a wall color of the physical space, wherein the one or more insights are conclusions corroborated by a connection between two or more items within the metadata;
determining, by one or more computer processors, the first data associated with the utilization of the first floor plan of the physical space exceeds a space utilization threshold;
based on the first data associated with the utilization of the physical space exceeding the space utilization threshold and on the generated one or more insights, generating, by one or more computer processors, second data associated with the physical space, wherein the second data comprises a second floor plan design layout, a frequency and a duration of time spent by one or more users in certain types or locations of spaces, recommendations for improvement to space utilization, an active view of how the space is being utilized and movement simulations to one or more other locations within the physical space, wherein the second floor plan design layout is a modified version of the first floor plan; and
sending, by one or more computer processors, a notification to a facilities manager to alert the facilities manager that the space utilization threshold has been exceeded, wherein the notification includes the generated second data associated with the physical space.

2. The computer-implemented method of claim 1, further comprising:
retrieving, by one or more computer processors, third data associated with one or more users of the physical space.

3. The computer-implemented method of claim 1, wherein the metadata associated with the first data associated with the utilization of the physical space is at least one of: a date associated with the first data associated with the utilization of the physical space, a time associated with the first data associated with the utilization of the physical space, time spent in the physical space by a user, a total time spent by all users of the physical space, a current weather condition, a décor of the physical space, fourth data describing the physical space, a CAD plan of the physical space, an OSCRE code associated with the physical space, a building identification, a floor number, a temperature in the physical space, a humidity in the physical space, a noise level in the physical space, and a lighting level in the physical space.

4. The computer-implemented method of claim 2, wherein the third data associated with the one or more users of the physical space is at least one of: a user profile, a job role of the user, health data, a temperature, a heart rate, a blood pressure, a height, and weight.

5. The computer-implemented method of claim 1, wherein the notification includes at least one of: a recommendation of one or more other locations to which one or more users of the physical space can move to reduce the utilization of the physical space; a recommendation to the one or more users of the physical space to avoid a location, a first report of the generated second data associated with the physical space, a second report that summarizes one or more physical spaces for which the utilization of the physical space exceeds the space utilization threshold, a third report that summarizes one or more physical spaces are available to alleviate overcrowding, a fourth report that summarizes one or more physical spaces that attract too many users, a fifth report that summarizes one or more physical spaces that are underutilized, and a recommendation for physical spaces in a building with safer user densities.

6. The computer-implemented method of claim 1, wherein the space utilization threshold is based on at least one of one or more social distancing requirements, a maximum occupancy level, and one or more space attributes.

7. The computer-implemented method of claim 1, wherein the generated second data associated with the physical space is at least one of: data describing attributes of one or more users of the physical space that spend more time in certain types or locations of spaces, data that indicates a frequency and a duration of time spent by the one or more users of the physical space in certain types of physical spaces, one or more recommendations for improvement to space utilization, a proposal of an optimal design layout, an active view of how the physical space is being utilized, one or more movement simulations based on previous floor plan layouts, a comparison of movement patterns to one or more locations, a simulated flow of occupants, and a heat map simulation.

8. A computer program product comprising:
one or more computer readable storage media and program instructions collectively stored on the one or more computer readable storage media, the stored program instructions comprising:
program instructions to monitor first data associated with a utilization of a first floor plan of a physical space;
program instructions to generate one or more insights regarding the utilization of the first floor plan based on metadata associated with the first data, wherein the metadata includes a wall color of the physical space, wherein the one or more insights are conclusions corroborated by a connection between two or more items within the metadata;
program instructions to determine the first data associated with the utilization of the first floor plan of the physical space exceeds a space utilization threshold;
based on the first data associated with the utilization of the physical space exceeding the space utilization threshold and on the generated one or more insights, program instructions to generate second data associated with the physical space, wherein the second data comprises a second floor plan design layout, a frequency and a duration of time spent by one or more users in certain types or locations of spaces, recommendations for improvement to space utilization, an active view of how the space is being utilized and movement simulations to one or more other locations within the physical space, wherein the second floor plan design layout is a modified version of the first floor plan; and
program instructions to send a notification to a facilities manager to alert the facilities manager that the space utilization threshold has been exceeded, wherein the notification includes the generated second data associated with the physical space.

9. The computer program product of claim 8, the stored program instructions further comprising:
program instructions to retrieve third data associated with one or more users of the physical space.

10. The computer program product of claim 8, wherein the metadata associated with the first data associated with the utilization of the physical space is at least one of: a date associated with the first data associated with the utilization of the physical space, a time associated with the first data associated with the utilization of the physical space, time spent in the physical space by a user, a total time spent by all users of the physical space, a current weather condition, a décor of the physical space, fourth data describing the physical space, a CAD plan of the physical space, an OSCRE code associated with the physical space, a building identification, a floor number, a temperature in the physical space, a humidity in the physical space, a noise level in the physical space, and a lighting level in the physical space.

11. The computer program product of claim 9, wherein the third data associated with the one or more users of the physical space is at least one of: a user profile, a job role of the user, health data, a temperature, a heart rate, a blood pressure, a height, and weight.

12. The computer program product of claim 8, wherein the notification includes at least one of: a recommendation of one or more other locations to which one or more users of the physical space can move to reduce the utilization of the physical space; a recommendation to the one or more users of the physical space to avoid a location, a first report of the generated second data associated with the physical space, a second report that summarizes one or more physical spaces for which the utilization of the physical space exceeds the space utilization threshold, a third report that summarizes one or more physical spaces are available to alleviate overcrowding, a fourth report that summarizes one or more physical spaces that attract too many users, a fifth report that summarizes one or more physical spaces that are underutilized, and a recommendation for physical spaces in a building with safer user densities.

13. The computer program product of claim 8, wherein the space utilization threshold is based on at least one of one or more social distancing requirements, a maximum occupancy level, and one or more space attributes.

14. The computer program product of claim 8, wherein the generated second data associated with the physical space is at least one of: data describing attributes of one or more users of the physical space that spend more time in certain types or locations of spaces, data that indicates a frequency and a duration of time spent by the one or more users in certain types of physical spaces, one or more recommendations for improvement to space utilization, a proposal of an optimal design layout, an active view of how the physical space is being utilized, one or more movement simulations based on previous floor plan layouts, a comparison of movement patterns to one or more locations, a simulated flow of occupants, and a heat map simulation.

15. A computer system comprising:
one or more computer processors;
one or more computer readable storage media;
program instructions collectively stored on the one or more computer readable storage media for execution by at least one of the one or more computer processors, the stored program instructions comprising:
program instructions to monitor first data associated with a utilization of a first floor plan of a physical space;
program instructions to generate one or more insights regarding the utilization of the first floor plan based on metadata associated with the first data, wherein the metadata includes a wall color of the physical space, wherein the one or more insights are conclusions corroborated by a connection between two or more items within the metadata;
program instructions to determine the first data associated with the utilization of the first floor plan of the physical space exceeds a space utilization threshold;
based on the first data associated with the utilization of the physical space exceeding the space utilization threshold and on the generated one or more insights, program instructions to generate second data associated with the physical space, wherein the second data comprises a second floor plan design layout, a frequency and a duration of time spent by one or more users in certain types or locations of spaces, recommendations for improvement to space utilization, an active view of how the space is being utilized and movement simulations to one or more other locations within the physical space, wherein the second floor plan design layout is a modified version of the first floor plan; and
program instructions to send a notification to a facilities manager to alert the facilities manager that the space utilization threshold has been exceeded, wherein the notification includes the generated second data associated with the physical space.

16. The computer system of claim 15, the stored program instructions further comprising:
program instructions to retrieve third data associated with one or more users of the physical space.

17. The computer system of claim 16, wherein the metadata associated with the first data associated with the utilization of the physical space is at least one of: a date associated with the first data associated with the utilization of the physical space, a time associated with the first data associated with the utilization of the physical space, time spent in the physical space by a user, a total time spent by all users of the physical space, a current weather condition, a décor of the physical space, fourth data describing the physical space, a CAD plan of the physical space, an OSCRE code associated with the physical space, a building identification, a floor number, a temperature in the physical space, a humidity in the physical space, a noise level in the physical space, and a lighting level in the physical space.

18. The computer system of claim 15, wherein the notification includes at least one of: a recommendation of one or more other locations to which one or more users of the physical space can move to reduce the utilization of the physical space; a recommendation to the one or more users of the physical space to avoid a location, a first report of the generated second data associated with the physical space, a second report that summarizes one or more physical spaces for which the utilization of the physical space exceeds the space utilization threshold, a third report that summarizes one or more physical spaces are available to alleviate overcrowding, a fourth report that summarizes one or more physical spaces that attract too many users, a fifth report that summarizes one or more physical spaces that are underutilized, and a recommendation for physical spaces in a building with safer user densities.

19. The computer system of claim 15, wherein the space utilization threshold is based on at least one of one or more social distancing requirements, a maximum occupancy level, and one or more space attributes.

20. The computer system of claim 15, wherein the generated second data associated with the physical space is at least one of: data describing attributes of one or more users of the physical space that spend more time in certain types or locations of spaces, data that indicates a frequency and a duration of time spent by the one or more users in certain types of physical spaces, one or more recommendations for improvement to space utilization, a proposal of an optimal design layout, an active view of how the physical space is being utilized, one or more movement simulations based on previous floor plan layouts, a comparison of movement patterns to one or more locations, a simulated flow of occupants, and a heat map simulation.

* * * * *